(12) United States Patent
Liu

(10) Patent No.: US 7,127,375 B2
(45) Date of Patent: Oct. 24, 2006

(54) NON-UNIFORMITY PATTERN IDENTIFICATION SYSTEMS AND METHODS THEREOF

(75) Inventor: Chia-Chun Liu, Hsin-Chu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 140 days.

(21) Appl. No.: 10/963,093

(22) Filed: Oct. 12, 2004

(65) Prior Publication Data

US 2006/0080061 A1    Apr. 13, 2006

(51) Int. Cl.
*G06F 11/30* (2006.01)
*G21C 17/00* (2006.01)

(52) U.S. Cl. .................................................. 702/183

(58) Field of Classification Search ............ 702/33–36, 702/81–84, 182–185, 189; 700/108–110; 382/141, 145, 149; 438/10, 17
See application file for complete search history.

(56) References Cited

U.S. PATENT DOCUMENTS 5,787,190 A * 7/1998 Peng et al. ................. 382/145

* cited by examiner

*Primary Examiner*—Michael Nghiem
(74) *Attorney, Agent, or Firm*—Thomas, Kayden, Horstemeyer & Risley

(57) ABSTRACT

A system for non-uniformity pattern identification. A storage device stores multiple theoretical patterns and measurements. Each measurement corresponds to a region on a wafer. The processing unit acquires the theoretical patterns and the measurements on at least two wafers, calculates pattern scores for the respective theoretical patterns of each wafer according to the measurements, and groups at least two of the theoretical patterns into at least one factor according to the pattern scores to identify one or more non-uniformity patterns for the wafers. Each pattern score represents the extent of similarity between one of the theoretical patterns and the measurements in one of the wafers.

25 Claims, 9 Drawing Sheets
(3 of 9 Drawing Sheet(s) Filed in Color)

| WAT Parameter | Factor Composition | Explained Variance | Comment |
|---|---|---|---|
| Isat_N4 | P6+P9+P4+P3+P2 (40.81%) | 70.60% | • The non-uniformity pattern is more significant than Isat_N6 |
| | P8+P5 (15.82%) | | |
| | P8+P7 (13.98%) | | • Similar to Isat_P4 |
| Isat_P4 | P6+P9+P2+P4+P3 (45.72%) | 65.28% | • The non-uniformity pattern is more significant than Isat_N6 |
| | P5+P8 (19.56%) | | |
| Isat_N6 | P6+P4 (26.20%) | 52.65% | • Similar to Isat_N4 |
| | P8+P9 (13.46%) | | |
| | P2 (13%) | | |
| Isat_P6 | P5+P3+P2 (29.1%) | 57.19% | • The non-uniformity pattern is more significant than Isat_N6 |
| | P8+P9 (14.68%) | | |
| | P4 (13.40%) | | |

NON-UNIFORMITY PATTERN IDENTIFICATION SYSTEMS AND METHODS THEREOF

BACKGROUND

The present invention relates to semiconductor manufacturing technology, and more particularly, to a method and system of non-uniformity pattern identification.

A conventional semiconductor factory typically includes the requisite fabrication tools necessary to process semiconductor wafers for a particular purpose, such as photolithography, chemical-mechanical polishing, or chemical vapor deposition. During manufacture, the semiconductor wafer passes through a series of process steps, which are performed by various fabrication tools. For example, in the production of an integrated semiconductor product, the semiconductor wafer passes through up to 600 process steps. The costs for such automated production are influenced to a great extent by the question as to how well and efficiently the manufacturing process can be monitored or controlled, so that the ratio of defect-free products to the overall number of products manufactured (i.e., yield ratio) achieves as great a value as possible. The individual process steps, however, are subject to fluctuations and irregularities, which in the worst case may mean, for example, the defect of a number of chips or the entire wafer. Therefore, each individual process step must be carried out as stably as possible in order to ensure an acceptable yield after the completed processing of a wafer. The fluctuations, irregularities and instability of a process step will cause so-called non-uniformity patterns, reducing yield. There may be various types of with-in-wafer (WIW) non-uniformity patterns of particular data, e.g., in-line process manufacturing parameters, wafer acceptance test (WAT) parameters, circuit probing (CP) test parameters and the like, subject to various fabrication issues. In the past, simple calculation algorithms, such as range value, and standard deviation, with predetermined thresholds have been used to determine whether a wafer suffers from WIW non-uniformity. Identification of WIW non-uniformity patterns, however, is done by human effort. The labor-intensive nature of WIW non-uniformity pattern identification using conventional means severely hinders efficiency. Therefore, a need exists for a system and method of non-uniformity pattern identification, to not only improve efficiency, but also provide a more effective and reliable result.

SUMMARY

An embodiment of a system for non-uniformity pattern identification comprises a storage device and a processing unit. The storage device stores multiple theoretical patterns and measurements. Each measurement corresponds to a region on a wafer. The processing unit acquires the theoretical patterns and the measurements on at least two wafers, calculates pattern scores for the respective theoretical patterns of each wafer according to the measurements, and groups at least two of the theoretical patterns into at least one factor according to the pattern scores to identify non-uniformity patterns for the wafers. Each pattern score represents the extent of similarity between one of the theoretical patterns and the measurements in one of the wafers. The processing unit may further output a graph corresponding to the factor to an output device. The graph may comprise a contour, a box plot chart or a histogram.

An embodiment of methods for non-uniformity pattern identification comprises acquiring multiple theoretical patterns, acquiring multiple measurements on at least two wafers, calculating pattern scores for the respective theoretical patterns of each wafer according to the measurements, and grouping at least two of the theoretical patterns into at least one factor according to the pattern scores to identify non-uniformity patterns for the wafers. Each measurement corresponds to a region on one of the wafers. Each pattern score represents the extent of similarity between one of the theoretical patterns and the measurements on one of the wafers. Preferably, the method additionally comprises outputting a graph corresponding to the factor to an output device, in which the graph may be a contour, a box plot chart or a histogram.

An embodiment of a machine-readable storage medium stores a computer program which when executed performs the method of non-uniformity pattern identification.

Preferably, the theoretical patterns may comprise a uniformity pattern and a plurality of non-uniformity patterns. The theoretical patterns may be implemented in a matrix, a two-dimensional array, a linked list or a tree. The region may cover one or more dies on a wafer, or cover a portion of one die. The measurements may be electrical measurements or physical measurements, acquired during wafer acceptance test (WAT) or in-line processing measurement.

In pattern score calculation, in one example, the pattern scores for the respective theoretical patterns of each wafer may be calculated by a correlation analysis algorithm or a data classification method according to the measurements. In another example, the pattern scores may be calculated by the following equation:

$$MT_{m \times m} \times \begin{bmatrix} W1 \\ \vdots \\ \vdots \\ \vdots \\ Wm \end{bmatrix} \times \frac{1}{L} = \begin{bmatrix} P1 \\ P2 \\ \vdots \\ \vdots \\ Pm \end{bmatrix},$$

where $MT_{m \times m}$ represents the m-by-m matrix for m theoretical patterns, W1 to Wm represent measurements individually occurring in the respective regions, L represents an individual standardization factor, which is the square root of the sum of the square of the cell values for each rows 1 to m, and P1 to Pm represent the pattern scores. In factor generation, the theoretical patterns are grouped into factors using a principal component analysis (PCA) or a data clustering algorithm.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The aforementioned objects, features and advantages of the invention will become apparent by referring to the following detailed description of embodiments with reference to the accompanying drawings, wherein:

FIG. 5 is a diagram of exemplary results of factor generation;

DESCRIPTION

Figure 1:
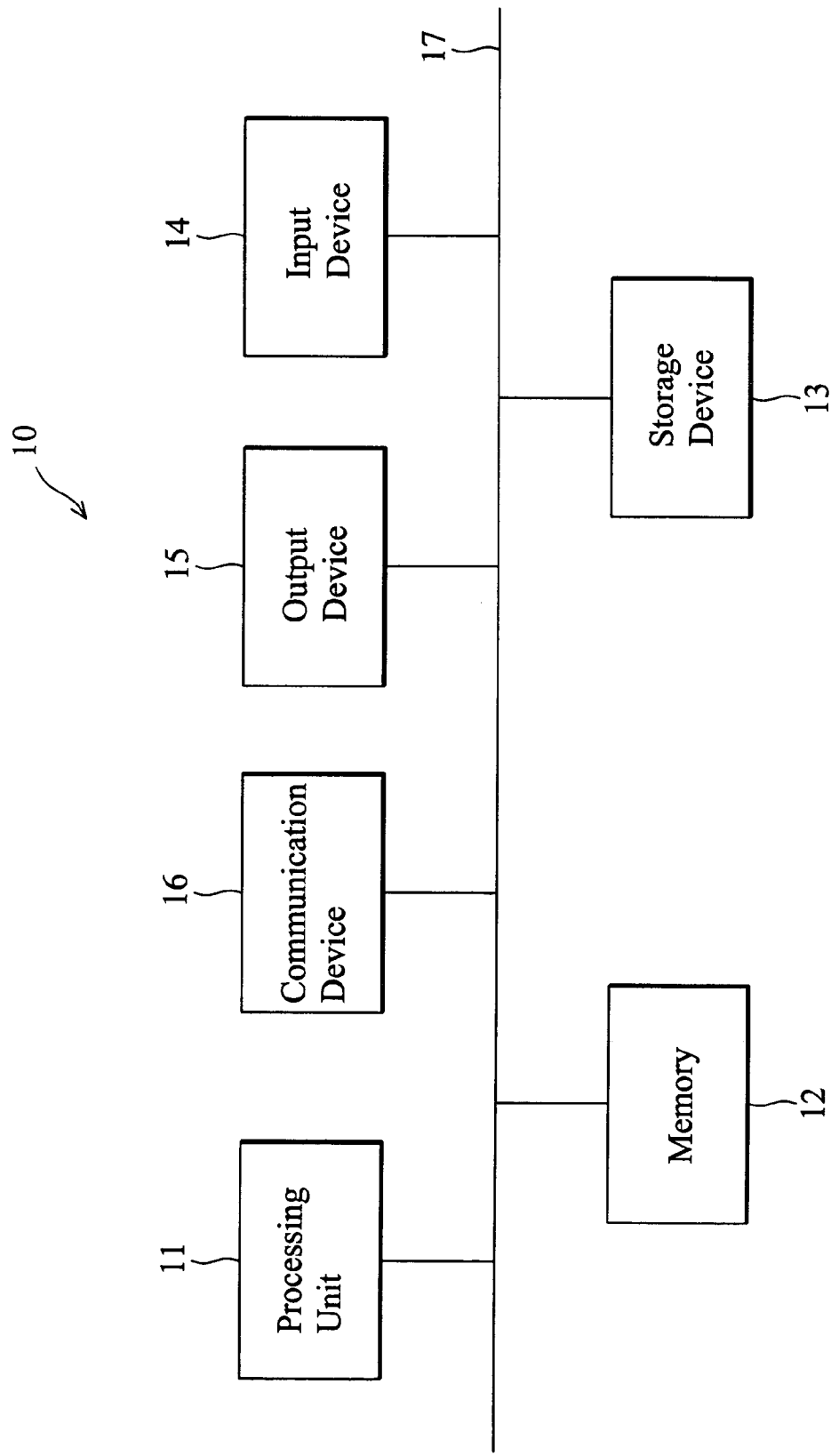
FIG. 1 is a diagram of an embodiment of a hardware environment.

It is understood, however, that the following disclosure provides many different embodiments, for examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a diagram of an embodiment of a hardware environment. The description of FIG. 1 is provides a brief, general description of suitable computer hardware and a suitable computing environment in conjunction with which at least some embodiments may be implemented. The hardware environment of FIG. 1 includes a processing unit 11, a memory 12, a storage device 13, an input device 14, an output device 15 and a communication device 16. The processing unit 11 is connected by buses 17 to the memory 12, storage device 13, input device 14, output device 15 and communication device 16 based on Von Neumann architecture. There may be one or more processing units 11, such that the processor of the computer comprises a single central processing unit (CPU), a micro processing unit (MPU) or multiple processing units, commonly referred to as a parallel processing environment. The memory 12 is preferably a random access memory (RAM), but may also include read-only memory (ROM) or flash ROM. The memory 12 preferably stores program modules executed by the processing unit 11 to perform experiment management functions. Generally, program modules include routines, programs, objects, components, or others, that perform particular tasks or implement particular abstract data types. Moreover, those skilled in the art should understand that at least some embodiments may be practiced with other computer system configurations, including hand-held devices, multiprocessor-based, microprocessor-based or programmable consumer electronics, network PCs, minicomputers, mainframe computers, and the like. Some embodiments may also be practiced in distributed computing environments where tasks are performed by remote processing devices linked through a communication network. In a distributed computing environment, program modules may be located in both local and remote memory storage devices based on various remote access architecture such as DCOM, CORBA, Web object, Web Services or other similar architectures. The storage device 13 may be a hard drive, magnetic drive, optical drive, a portable drive, or nonvolatile memory drive. The drives and their associated computer-readable media (if required) provide nonvolatile storage of computer-readable instructions, data structures, program modules and experiment lot processing records. The processing unit 11, controlled by program modules received from the memory 12 and from an operator through the input device, directs experiment management functions. The storage device 13 may comprise a database management system, an object base management system, a file management system, or others, to store multiple experiment plan records, merge constraints and scheduling rules.

Figure 2:
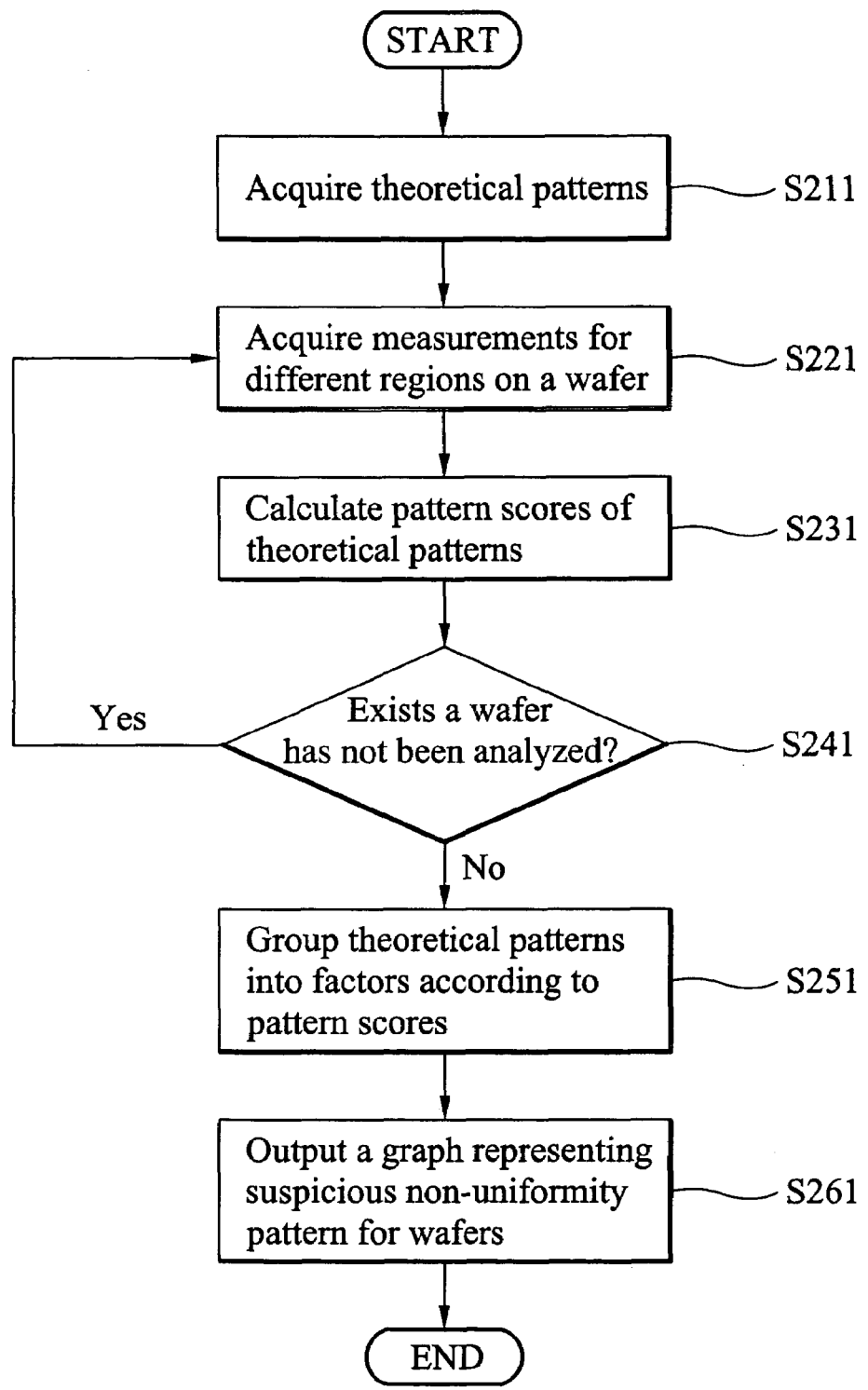
FIG. 2 is a flowchart showing an embodiment of methods for non-uniformity pattern identification.

This embodiment described in the following discloses methods for non-uniformity pattern identification implemented in program modules and executed by the processing unit 11. FIG. 2 is a flowchart showing an embodiment of methods for non-uniformity pattern identification. The process of FIG. 2 begins in step S211 to acquire multiple theoretical patterns from the storage device 13. Theoretical patterns including uniformity pattern and non-uniformity patterns may preferably be simulated by a matrix (also called a feature space) or others. In one example, equation (1) shows the 9-by-9 matrix $MT_{9\times 9}$ for theoretical patterns.

Figure 3:
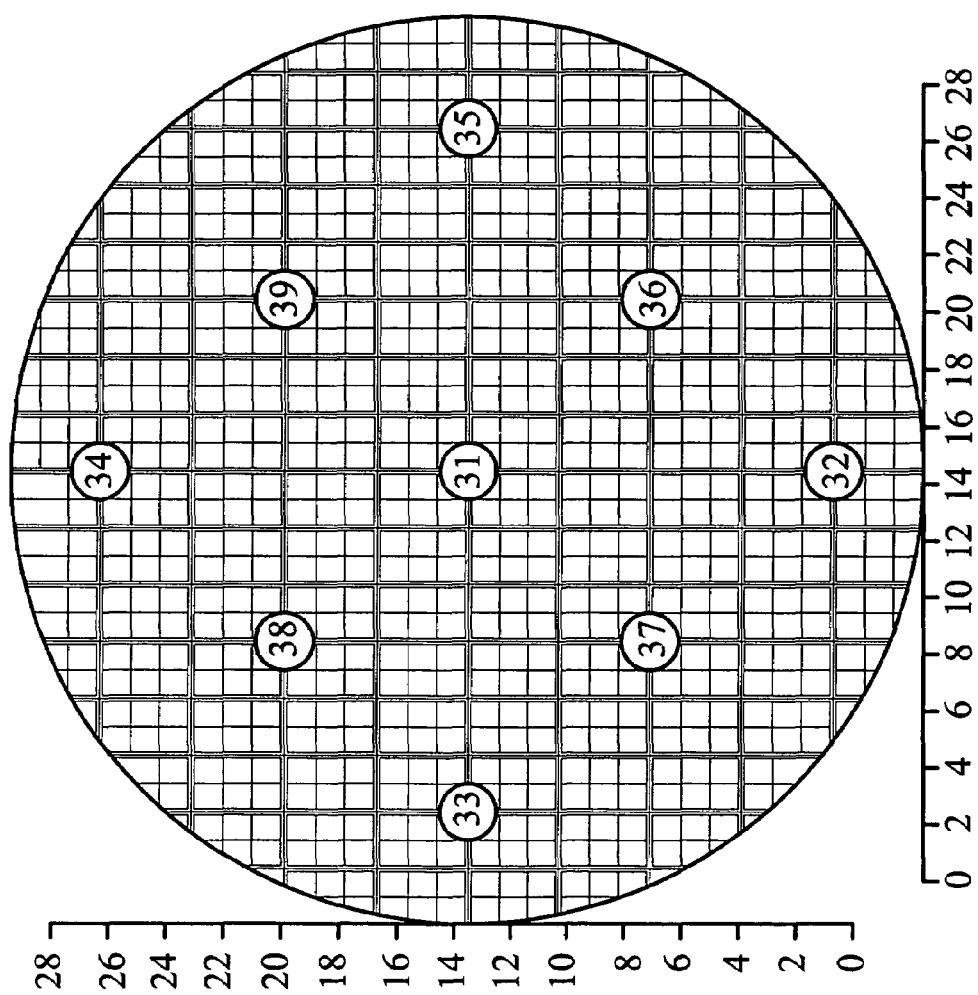
FIG. 3 is a schematic diagram of an exemplary wafer.
Figure 4A:
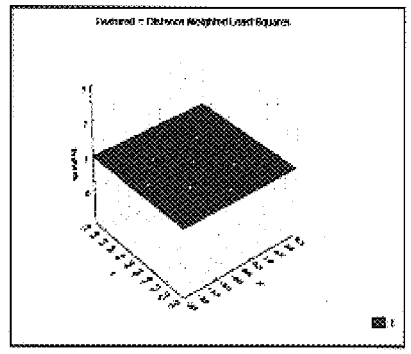
FIGS. 4a to 4i are 3D diagrams showing theoretical patterns.
Figure 4B:
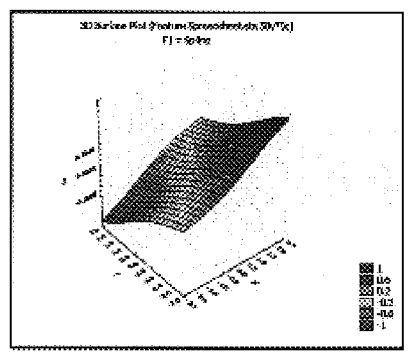
Figure 4C:
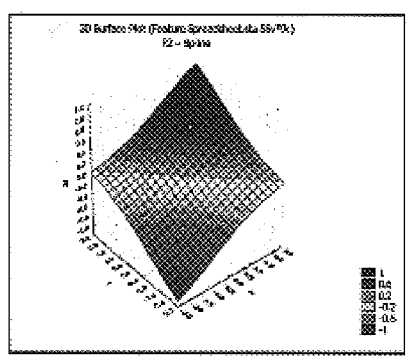
Figure 4D:
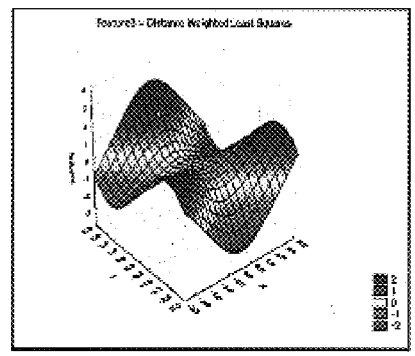
Figure 4E:
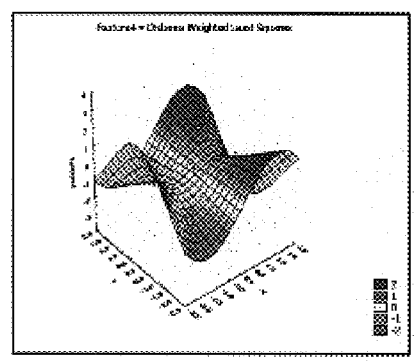
Figure 4F:
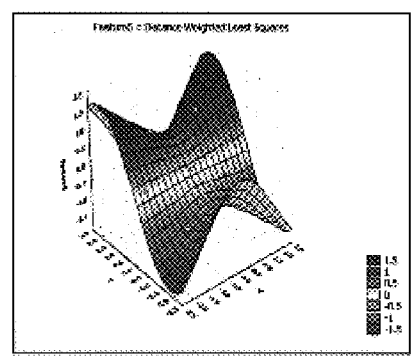
Figure 4G:
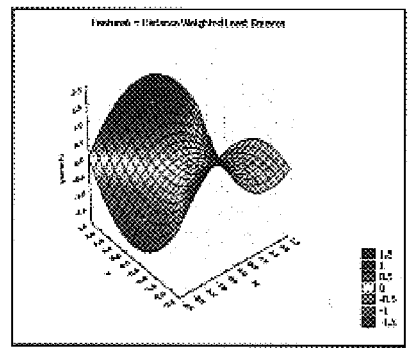
Figure 4H:
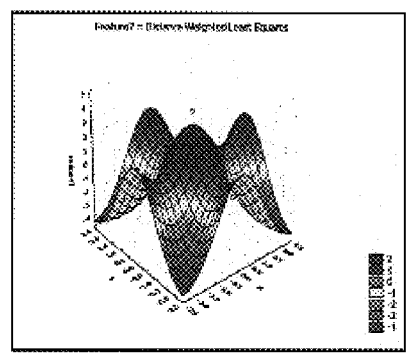
Figure 4I:
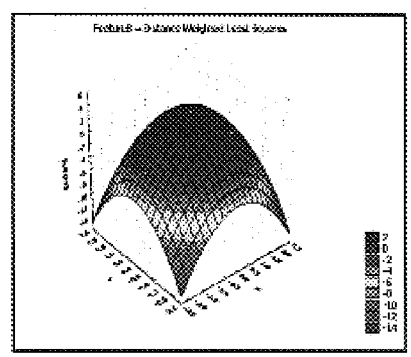

Equation (1):

$$MT_{9\times 9} = \begin{bmatrix} 1 & 1 & 1 & 1 & 1 & 1 & 1 & 1 & 1 \\ 0 & 1 & -1 & -1 & 1 & \sqrt{2} & 0 & -\sqrt{2} & 0 \\ 0 & -1 & -1 & 1 & 1 & 0 & -\sqrt{2} & 0 & \sqrt{2} \\ 0 & -\sqrt{2} & 0 & \sqrt{2} & 0 & 1 & -1 & -1 & 1 \\ 0 & 0 & \sqrt{2} & 0 & -\sqrt{2} & 1 & -1 & -1 & 1 \\ 0 & 0 & 0 & 0 & 0 & -1 & -1 & 1 & 1 \\ 0 & 1 & -1 & 1 & -1 & 0 & 0 & 0 & 0 \\ 4 & 1 & 1 & 1 & 1 & -2 & -2 & -2 & -2 \\ 4 & -2 & -2 & -2 & -2 & 1 & 1 & 1 & 1 \end{bmatrix},$$

where each column indicates a particular measurement region, and each row represents a theoretical pattern. Preferably, any two of the theoretical patterns are orthogonal. Those skilled in the art will recognize that less or more rows can be used to simulate less or more theoretical patterns, and less or more columns can be used to indicate less or more measurement regions. Those skilled in the art will also appreciate that various data structures, such as two-dimensional arrays, linked lists, trees, and the like, may be used to represent theoretical patterns. The implementation of theoretical patterns is not limited to vectors, but may be implemented as equations and the like. FIG. 3 is a schematic diagram of an exemplary wafer. In this example, actual patterns for a wafer may be examined by acquiring data from nine measurement locations 31 to 39. Referring to equation (1), columns 1 to 9 in this matrix respectively associate with measurement locations 31 to 39. FIGS. 4a to 4i are 3D diagrams showing theoretical patterns. For example, row 1 simulates the uniformity pattern of FIG. 4a. Row 2 simulates the uniformity pattern of FIG. 4b wherein the distribution of measurement results on a wafer descends gradually from the lower-right region to the upper-left region. Row 3 simulates the uniformity pattern of FIG. 4c wherein the distribution of measurement results on a wafer descends gradually from the upper-right region to the lower-left region. Row 9 simulates the uniformity pattern of FIG. 4i wherein the distribution of measurement results on a wafer descends circularly from the center to the edge.

Next, a loop (steps S221 to S241) is used to calculate pattern scores of theoretical patterns representing the extent of similarity between theoretical patterns and measurements wafer by wafer. In step 221, measurements (e.g., electrical or physical measurements) in different regions on a wafer are received from the storage device 13. Each region may cover one or more dies on a wafer, or cover portions of one die. Electrical or physical parameter measurement may be acquired during wafer acceptance tests (WAT), in-line processing measurements and the like. Each measurement may represent an electrical value, such as voltage level, resistance, power level and the like, or a physical value, such as line width, overlay, thickness and the like, for one or more semiconductor devices. For example, wafer acceptance test (WAT) data is generated by electrical measurements of these test structures after completion of the entire fabrication process. Several sites located on the fixed locations on each wafer are selected, from which over 100 WAT parameters are measured. In step S231, patterns scores with theoretical patterns for a wafer are calculated, representing the extent of similarity between theoretical patterns and actual measurements on wafers. In one example, equation (2) shows the formula for calculating pattern scores.

Equation (2):

$$MT_{9\times 9} \times \begin{bmatrix} w1 \\ w2 \\ w3 \\ w4 \\ w5 \\ w6 \\ w7 \\ w8 \\ w9 \end{bmatrix} \times \frac{1}{L} = \begin{bmatrix} P1 \\ P2 \\ P3 \\ P4 \\ P5 \\ P6 \\ P7 \\ P8 \\ P9 \end{bmatrix},$$

where $MT_{9\times 9}$ represents the 9-by-9 matrix for theoretical patterns as shown in equation (1), w1 to w9 represent measurements in different regions, L represents an individual standardization factor, which is the square root of the sum of the square of the cell values for each rows 1 to 9, and P1 to P9 represent pattern scores. For example, standardization factor in row 9 is L9=sqrt($4^2+(-2)^2+(-2)^2+(-2)^2+(-2)^2+1^2+1^2+1^2+1^2$)=6. Those skilled in the art will also appreciate that pattern scores may also be calculated by various techniques, such as a variety of correlation analysis algorithms, data classification methods, or others, with relevant implementation of theoretical patterns. In step S241, the process determines whether a wafer that has not been analyzed is present, if so, the process proceeds to step S221, and otherwise, to step S251. Thus, suspicious non-uniformity patterns of analyzed wafers may be the theoretical patterns with the highest pattern score.

Although the suspicious non-uniformity pattern of analyzed wafers can be determined by pattern scores of theoretical patterns, in most situations, a real non-uniformity pattern is a combination of two or more theoretical patterns. In step S251, non-uniformity theoretical patterns are grouped into factors according to pattern scores using various factor analysis techniques, such as principal component analysis (PCA), a variety of data clustering algorithms. FIG. 5 is a diagram of exemplary results of factor generation. Rows 51 to 54 illustrate factor analysis results for four WAT parameters "Isat_N4", "Isat_P4", "Isat_N6" and "Isat_P6". The factor composition column shows theoretical pattern combinations for factors, for example, in WAT parameters "Isat_N4", 3 factors are generated by PCA. Three factors individually contain pattern combination (P6, P9, P4, P3, P2), (P8, P5) and (P8, P7). The first factor has the highest explanability (40.81%) over the other two factors, thus, the first factor may be the most likely suspicious non-uniformity pattern.

Figure 6:
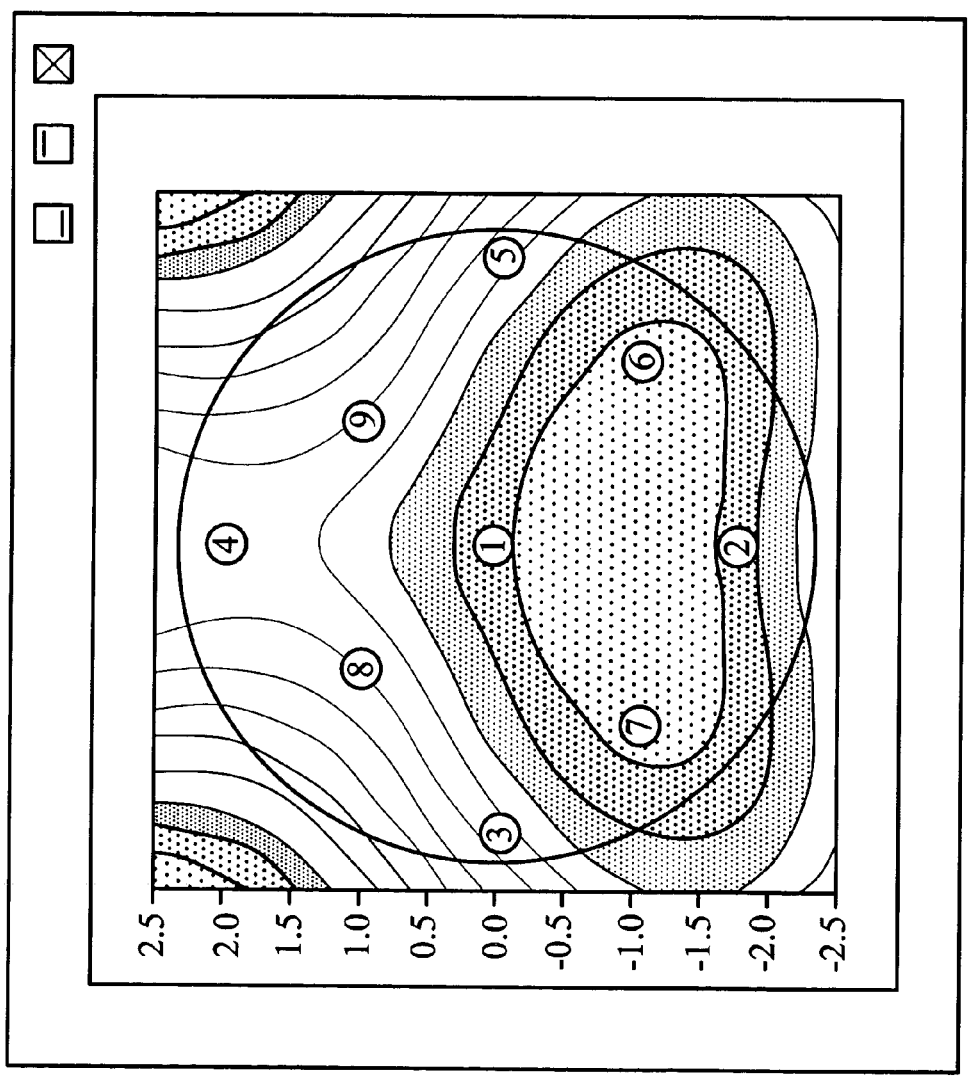
FIG. 6 is an exemplary contour of a non-uniformity pattern depicting a theoretical pattern combination.

In step S261, graphs, such as contours, box plot charts, histograms and the like, corresponding to a factor are sent to the output device 15. FIG. 6 is an exemplary contour of a non-uniformity pattern depicting an identified pattern combination. The output device 15 may be a display device, such as a monitor screen, a projector and the like, or a printing device, such as a printer, a plotter and the like.

Figure 7:
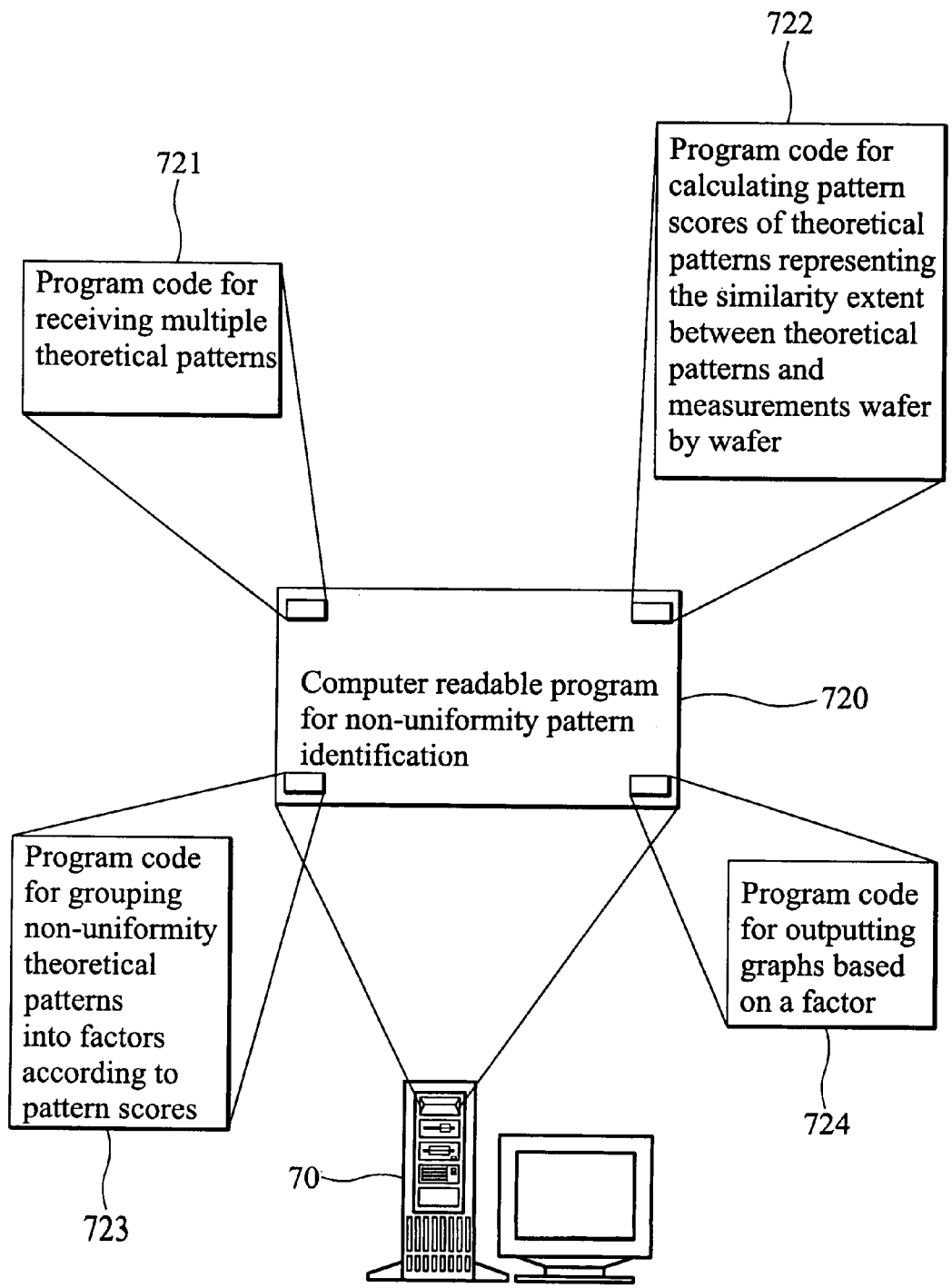
FIG. 7 is a diagram of storage medium for a computer program providing the method of non-uniformity pattern identification according to an embodiment.

Embodiments of the invention provide additionally a storage medium as shown in FIG. 7 storing a computer program 720 for executing the disclosed methods of non-uniformity pattern identification. The computer program product includes a storage medium 70 having computer readable program code embodied in the medium for use in a computer system, the computer readable program code comprising at least computer readable program code 721 receiving multiple theoretical patterns, computer readable program code 722 calculating pattern scores of theoretical patterns representing the extent of similarity between theoretical patterns and measurements wafer by wafer, computer readable program code 723 grouping non-uniformity theoretical patterns into factors according to pattern scores and computer readable program code 724 outputting graphs based on a factor.

The methods and systems of the embodiments, or certain aspects or portions thereof, may take the form of program code (i.e., instructions) embodied in tangible media, such as floppy diskettes, CD-ROMS, hard drives, or any other machine-readable storage medium, wherein, when the program code is loaded into and executed by a machine, such as a computer, the machine becomes an apparatus for practicing the invention. The methods and apparatus of the present invention may also be embodied in the form of program code transmitted over some transmission medium, such as electrical wiring or cabling, through fiber optics, or via any other form of transmission, wherein, when the program code is received and loaded into and executed by a machine, such as a computer, the machine becomes an apparatus for practicing the invention. When implemented on a general-purpose processor, the program code combines with the processor to provide a unique apparatus that operates analogously to specific logic circuits.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A system of non-uniformity pattern identification, the system comprising:
   a storage device capable of storing a plurality of theoretical patterns and a plurality of measurements, in which each measurement corresponds to a region on a wafer; and
   a processing unit configured to acquire the theoretical patterns and the measurements on at least two wafers, calculate pattern scores for the respective theoretical patterns of each wafer according to the measurements, in which each pattern score represents the extent of similarity between one of the theoretical patterns and the measurements on one of the wafers, and groups at least two of the theoretical patterns into at least one factor according to the pattern scores to identify a non-uniformity pattern for the wafers.

2. The system of claim 1 wherein the theoretical patterns comprise a uniformity pattern and a plurality of non-uniformity patterns.

3. The system of claim 1 wherein the theoretical patterns are implemented in a matrix, a two-dimensional array, a linked list or a tree.

4. The system of claim 1 wherein the region covers one or more dies on the wafer, or covers a portion of one die.

5. The system of claim 1 wherein the measurements are electrical measurements or physical measurements.

6. The system of claim 1 wherein the pattern scores are calculated by a correlation analysis algorithm or a data classification method according to the measurements.

7. The system of claim 1 wherein the pattern scores are calculated by an equation:

$$MT_{m \times m} \times \begin{bmatrix} W1 \\ \vdots \\ \vdots \\ \vdots \\ Wm \end{bmatrix} \times \frac{1}{L} = \begin{bmatrix} P1 \\ P2 \\ \vdots \\ \vdots \\ Pm \end{bmatrix},$$

wherein $MT_{m \times m}$ represents the m-by-m matrix for m theoretical patterns, W1 to Wm represent measurements individually occurring in the respective regions, L represents an individual standardization factor, which is the square root of the sum of the square of the cell values for each row 1 to m, and P1 to Pm represent the pattern scores.

8. The system of claim 1 wherein the theoretical patterns are grouped into the factor using a principal component analysis (PCA) or a data clustering algorithm.

9. The system of claim 1 wherein the factor has highest explanability.

10. The system of claim 1 wherein the measurements are acquired during a wafer acceptance test (WAT) or an in-line processing measurement.

11. The system of claim 1 wherein the processing unit outputs a graph corresponding to the factor to an output device.

12. The system of claim 11 wherein the graph comprises a contour, a box plot chart or a histogram.

13. A method of non-uniformity pattern identification, the method comprising using a computer to perform the steps of:
    acquiring a plurality of theoretical patterns;
    acquiring a plurality of measurements on at least two wafers, in which each measurement corresponds to a region on one wafer;
    calculating pattern scores for the respective theoretical patterns of each wafer according to the measurements, in which each pattern score represents the extent of similarity between one of the theoretical patterns and the measurements in one of the wafers; and
    grouping at least two of the theoretical patterns into at least one factor according to the pattern scores to identify a non-uniformity pattern for the wafers.

14. The method of claim 13 wherein the theoretical patterns comprise a uniformity pattern and a plurality of non-uniformity patterns.

15. The method of claim 13 wherein the theoretical patterns are implemented in a matrix, a two-dimensional array, a linked list or a tree.

16. The method of claim 13 wherein the region covers one or more dies on the wafer, or covers a portion of one die.

17. The method of claim 13 wherein the measurements are electrical measurements or physical measurements.

18. The method of claim 13 wherein the pattern scores are calculated by a correlation analysis algorithm or a data classification method according to the measurements.

19. The method of claim 13 wherein the pattern scores are calculated by an equation:

$$MT_{m \times m} \times \begin{bmatrix} W1 \\ \vdots \\ \vdots \\ \vdots \\ Wm \end{bmatrix} \times \frac{1}{L} = \begin{bmatrix} P1 \\ P2 \\ \vdots \\ \vdots \\ Pm \end{bmatrix},$$

wherein $MT_{m \times m}$ represents the m-by-m matrix for m theoretical patterns, W1 to Wm represent measurements individually occurring in the respective regions, L represents an individual standardization factor, which is the square root of the sum of the square of the cell values for each row 1 to m, and P1 to Pm represent the pattern scores.

20. The method of claim 13 wherein the theoretical patterns are grouped into factors using a principal component analysis (PCA) or a data clustering algorithm.

21. The method of claim 13 wherein the factor has highest explanability.

22. The method of claim 13 wherein the measurements are acquired during a wafer acceptance test (WAT) or an in-line processing measurement.

23. The method of claim 13 further comprising a step of outputting a graph corresponding to the factor to an output device.

24. The method of claim 23 wherein the graph comprises a contour, a box plot chart or a histogram.

25. A machine-readable storage medium for storing a computer program which when executed performs a method of non-uniformity pattern identification, the method comprising the steps of:
    acquiring a plurality of theoretical patterns;
    acquiring a plurality of measurements on at least two wafers, in which each measurement corresponds to a region on one wafer;
    calculating pattern scores for the respective theoretical patterns of each wafer according to the measurements, in which each pattern score represents the extent of similarity between one of the theoretical patterns and the measurements in one of the wafers; and
    grouping at least two of the theoretical patterns into at least one factor according to the pattern scores to identify a non-uniformity pattern for the wafers.

* * * * *